United States Patent [19]

Shoji

[11] Patent Number: 5,847,456
[45] Date of Patent: *Dec. 8, 1998

[54] SEMICONDUCTOR DEVICE

[75] Inventor: Kazutaka Shoji, Tokyo, Japan

[73] Assignee: NEC Corporation, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 802,315

[22] Filed: Feb. 18, 1997

[30]     Foreign Application Priority Data

Feb. 28, 1996  [JP]  Japan ..................... 8-041165

[51] Int. Cl.$^6$ ................ H01L 23/48; H01L 23/52; H01L 29/40; H01L 23/29
[52] U.S. Cl. ................ 257/737; 257/783; 257/693; 257/738; 257/780
[58] Field of Search ..................... 257/737, 738, 257/783, 787, 693, 698, 685, 686, 668, 780, 777, 778; 29/842, 843; 228/180.22

[56]         References Cited

U.S. PATENT DOCUMENTS 4,604,644  8/1986  Beckham et al. ................ 357/80
5,093,986  3/1992  Mandai et al. ................ 29/843
5,147,084  9/1992  Behun et al. ................ 228/56.3
5,293,067  3/1994  Thompson et al. ................ 257/668
5,591,941  1/1997  Acocella et al. ................ 257/738

FOREIGN PATENT DOCUMENTS 4219944  8/1992  Japan ................ H01L 21/60

OTHER PUBLICATIONS

"Electronic Packaging and Interconnection Hanbook", pp. 1.4–1.7; C. Harper.

Tsukada et al, Surface Laminar Circuit and Flip Chip Attach Packaging, IMC 1992 Proceedings, Yokohama, Jun. 3–Jun. 5, 1992, pp. 252–258.

Primary Examiner—Jerome Jackson
Assistant Examiner—Jhihan B Clark
Attorney, Agent, or Firm—Hayes, Soloway, Hennessey, Grossman & Hage, P.C.

[57]         ABSTRACT

Solder bumps (3) are provided with reinforcing resins (4), which are formed by applying resins thickly at the roots and gradually thinly toward the tips so as to surround the bumps. Thus, long-time reliability of solder connection parts is improved and repairability is simultaneously improved.

6 Claims, 7 Drawing Sheets

(AT H.T.)

(AT L.T.)

SEMICONDUCTOR DEVICE

BACKGROUND OF THE INVENTION

1. Field of the Invention

The present invention relates to a semiconductor device, more particularly to a semiconductor device having a package, which includes a flip chip, a ball grid array (BGA), etc., suited to highly dense mounting.

2. Description of the Related Art various novel forms of semiconductor devices have been developed in order to satisfy demands for compact and reduced weight, high-speed and high performance electronic equipment. As there are more intense demands for an increase in the number of pins and compact and thin devices due to higher chip integration, it is essential to make pitches finer so as to meet such demands. Consequently, there is now a trend to mount a flip chip, a BGA, etc., on a semiconductor device.

BGA can deal with an increase in the number of pins without making pitches finer for electrodes. This is because the electrodes mounted in one side full surface of a semiconductor device are arranged in an array, that is, in an area array, and the full surface of one side can be used. In addition, since the pitches are generally wider compared with those for flip chip mounting electrodes and solder bumps are larger, reliability after mounting is easily assured. However, the size of the semiconductor device is larger compared with that of the flip chip, and thus this is not suited to higher density mounting.

A flip chip connection technology has been successfully utilized so as to interconnect a number of I/O (Input/Output) solder bumps on a silicon chip and a semiconductor chip carrier, for instance an alumina carrier, for over twenty years.

According to this technology, by surrounding soldered spots between a semiconductor device and a hard carrier (supporting substrate) made of ceramic, etc., with a barrier, which does not get wet when melting soldering is carried out, surface tension by melting soldering prevents a coupled part from being destroyed when the connected part of the semiconductor device is melted, and consequently this semiconductor device is raised more than the surface of the carrier.

Normally, an integrated circuit semiconductor device is mounted on a supporting substrate, which is a hard carrier formed of a material having a thermal expansion factor different from that of silicon as a material for the semiconductor device. Usually, the semiconductor device is formed of single crystal silicon having a thermal expansion factor of $2.5 \times 10^{-6}/°C$. while the supporting substrate is formed of a ceramic material, typically alumina, having a thermal expansion factor of $5.8 \times 10^{-6}/°C$. During the operation of the semiconductor device, since heat is transmitted through the solder bumps, active and passive elements in the integrated circuit device produce heat as a result of fluctuations in the temperatures of both of the semiconductor device and the supporting substrate.

Therefore, the semiconductor device and the supporting substrate are expanded to different sizes due to the different thermal expansion factors as a result of temperature changes and connected together, and this stress produces distortions in the soldered and connected part, which has been fixed after cooling.

The above-noted technology is favorably fit for mounting of the semiconductor device on the hard ceramic supporting substrate. However, this is not suitable when an organic material is to be mounted on the substrate. To take an example as a reason for this, a difference in thermal expansion factors between silicon as a material for the semiconductor device and an organic material for the substrate is much larger than a difference experienced with respect to the ceramic substrate.

Referring to FIG. 1, which shows an example of damaged solder bumps when a semiconductor chip is mounted on a substrate made of an organic material, since there is a considerable difference in thermal expansion factors between the substrate and the semiconductor chip, the solder bumps are damaged as indicated by (B) during temperature cycle testing.

Recently published U.S. Pat. No. 4,604,644 (Literature 1) discloses an improved type solder interconnection structure, which has improved the fatigue life of a conventional first semiconductor device. This is a structure for electrically connecting a semiconductor device to a supporting substrate having a plurality of soldered connection points. In this structure, each soldered connection point joins a pad structure getting wet by solder on the device to a corresponding pad getting wet by solder on the hard supporting substrate and a dielectric material is placed between the peripheral region of the device and a region in a surface opposite the substrate. This dielectric material surrounds the longitudinal and lateral rows of at least one external side of the soldered connection point.

Referring to FIG. 2, which shows an example of a conventional second semiconductor device disclosed in Japanese Unexamined Patent Publication No. 4-219944 (Literature 2), in this conventional second semiconductor device, mounting reliability is improved by using a method of injecting a thermosetting resin between a chip and a substrate in order to prolong the fatigue life of a soldered connection point when the semiconductor device (chip) is mounted on the substrate made of an organic material.

In a conventional third semiconductor device described in pp. 252 to 258 of Proceedings of 7th International Microelectronics Conference, Yokohama (held in 1992) (Literature 3), a flip chip is mounted, an epoxy resin material is used for a substrate and a gap between the chip and the substrate is sealed by the epoxy resin. Herein, stress applied on a soldered connection part is reduced as a result of the stress dispersing effect of the sealing resin, thereby improving the life of the connected part more than that using the conventional ceramic substrate. (Not shown).

Referring to FIG. 3, which shows an example of a typical method of injecting resins, a semiconductor device is slightly inclined after having been mounted on a substrate, and then resins are injected by a resin injection nozzle placed between the semiconductor device and the substrate. In this case, resins are injected by utilizing a capillary phenomenon, and thus use is generally made of a low viscosity resin.

In order to solve the problem of the unsuitability of BGA to highly dense mounting, there have been available methods, for instance one disclosed in Japanese Unexamined Patent Publication No. 6-510396 (U.S. Pat. No. 5,293,067) (Literature 4). In a conventional fourth semiconductor device described in Literature 4, by making pitches smaller for electrodes to be mounted and arranging these in an area array (matrix) like those for BGA so as to solve the problem of BGA, mounting is facilitated, permitting highly dense mounting. (Not shown).

However, as pitches are made smaller, there is a possibility that problems of bridges, etc., will be created during mounting due to narrower spaces between the bumps. Thus, a conventional fifth semiconductor device was devised, which was disclosed in U.S. Pat. No. 5,147,084 (Literature 5). Referring to FIG. 4, which shows this conventional fifth semiconductor device, solder bridges are prevented from being produced by applying an epoxy resin on the high temperature solder connection part of its package.

As described above, the compact semiconductor devices including the flip chip, etc., had advantages in terms of miniaturization of the semiconductor device and improvement of electric performance. However, problems described below are inherent in the semiconductor devices of such types.

For a semiconductor device, efforts will also be made to increase the number of pins by increasing the number of electrode pads on a semiconductor chip in the future. In order to deal with such an increase in the number of electrode pads, it is necessary to increase the number of bumps and reduce the sizes thereof. A joining strength between a bump and a land is in proportion to the area of a joined part. For this reason, when a land on the semiconductor device is made small due to the increase in the number of pins, a joining strength between the bump and the land of the semiconductor device is reduced, producing cracks with application of heat impacts.

In actuality, when a flip chip is mounted, if peripheral arraying is general, pitches for the electrode pads on the chip must inevitably be made finer, also reducing the sizes of the solder bumps. Consequently, if only the flip chip is directly mounted on a substrate, for instance a printed board, having a large thermal expansion factor difference, strong stress is applied on the solder bumps and thus reliability is reduced after mounting.

When the semiconductor devices of other types are mounted on printed boards, as the sizes of the bumps are made smaller, the joined parts between the bumps and the lands of the semiconductor devices are broken due to differences in thermal expansion factors between the boards and the semiconductor devices during temperature cycle testing performed after mounting and while these are actually used as products.

If the solder bumps are enlarged in size so as to increase reliability after mounting, problems including the occurrence of bridges, etc., are created during mounting of the device on the substrate and formation of solder bumps.

When a semiconductor device having projected bumps is mounted on the substrate, in order to increase a joining strength between the semiconductor device and the substrate after mounting, by injecting an adhesive resin between the mounted semiconductor device and the substrate so as to fix the same on the substrate, the surroundings of the bumps are solidified by means of this adhesive resin. However, this method necessitates not only the addition of a process of injecting resins but also sufficient flux cleaning after mounting. In addition, even when a semiconductor chip failure and abnormality and abnormality in the electric connection part are detected after injection of adhesive resins, repairing cannot simply be made by replacing only the semiconductor chip, for which failure and abnormality have been detected.

When the semiconductor device and the substrate are connected together by means of a metal having a low melting point, in other words solder connection, the failed semiconductor device is disconnected from the substrate usually by heating the substrate with a temperature close to a solder melting point and alternatively higher during repairing. However, control cannot be performed so as to determine where the solder should remain, the semiconductor device or the substrate.

Therefore, efforts were made to solve the above-noted problem. To take an example, the conventional fifth semiconductor device described in Literature 5 tries to solve the problem by using high melting point solder for the bumps in the semiconductor device side and eutectic crystal solder in the substrate side. In this method, however, since the component of high temperature solder is melted into eutectic solder during first mounting, a condition for reflowing must be changed from second time mounting and after because of a change in the component of solder in the substrate side.

In the structure of the conventional fifth semiconductor device devised to prevent the occurrence of solder bridges, resins are uniformly applied on the entire surface of the side having the solder bumps (surface of the side mounted on the substrate). However, because of the uniform application of the resins, high shearing stress is generated in boundary parts between the solder bumps and the epoxy resins at the roots of the solder bumps due to a difference in thermal expansion factors between the substrate and the package when a temperature difference occurs after mounting. As a result, as shown in FIG. 5, cracks occur in the solder bumps, reducing reliability after mounting.

Shearing stress in the root part of the solder bump is generated irrespective of the thickness of the resin.

As shown in FIG. 6, the uniform application of the resins in the semiconductor device and the package results in a difference in thermal expansion factors between this package and the applied epoxy resin. Thus, the package is distorted due to stress caused by the thermal expansion factor difference when a temperature change occurs in the package. This in turn leads to the generation of tensile stress in the electric connection part between the substrate and the package. In other words, the uniform application of resins in the semiconductor device causes reduction in reliability after mounting.

If the applied resin thickness is thin enough to prevent the distortion of the semiconductor device from adversely affecting reliability after mounting, the bridge preventive effect is eliminated.

Thus, the drawbacks of the foregoing semiconductor devices are summarized as follows.

It is necessary to increase the number of bumps and reduce the sizes thereof in order to deal with the increase in the number of electrodes on the semiconductor chip due to the increase in the number of pins. However, since a joining strength between the bump and the land is in proportion to the area of the joined part, the joining strength is reduced when the land is made small and cracks are generated due to heat impacts, etc., which cause reduction in reliability.

Because of a difference in thermal expansion factors between the substrate and the semiconductor device, the bumps are destroyed in the connection parts with the land on the semiconductor device during temperature cycle testing after mounting and while this is actually used as a product.

When the solder bumps are enlarged in size so as to increase reliability after mounting, bridges are generated during mounting on the substrate and formation of the solder bumps.

The method of fixing the semiconductor device on the substrate after injecting adhesive resins between these so as to increase a joining strength after mounting, the method being used in both of the conventional second and third semiconductor devices, necessitates not only the addition of the process of injecting resins but also sufficient flux cleaning after mounting. Also, even when semiconductor chip failure and abnormality in the electric connection part are detected after the injection of adhesive resins, repairing cannot simply be made only by replacing the semiconductor chip, for which failure and abnormality are detected.

When the failed semiconductor device is disconnected from the substrate usually by heating the substrate with a temperature close to a solder melting point and alternatively higher during repairing, control cannot be performed so as to determine in where the solder should remain.

The conventional fifth semiconductor device was devised to solve the above-noted problem by using high melting point solder for the bumps in the semiconductor device side and eutectic crystal solder in the substrate side. However, this method necessitates a change in the condition for reflowing from second time mounting and after, since the component of high temperature solder is melted into eutectic crystal solder during first mounting, leading to a change in the component thereof.

In the conventional fifth semiconductor device, resins are uniformly applied on the entire mounting surface. Thus, because of a difference in thermal expansion factors between the substrate and the package, cracks occur in the solder bumps due to high shearing stress generated in the boundary parts between the solder bumps and the epoxy resins at the roots thereof when a temperature difference arises after mounting, consequently reducing reliability after mounting. In addition, since the package is distorted by stress generated when there is a temperature change in the package because of the thermal expansion factor difference between the semiconductor package and the uniformly applied resins, tensile stress is generated in the electric connection part between the substrate and the package, which causes reduction in reliability after mounting.

Furthermore, if the applied resin thickness is thin enough to prevent the distortion of the semiconductor device package from adversely affecting reliability after mounting, its bridge preventive effect is eliminated.

SUMMARY OF THE INVENTION

An object of the present invention is to provide a semiconductor device having a mounting structure, which simultaneously satisfies both reliability and repairability after mounting, and a manufacturing method of the same.

In accordance with the present invention, a semiconductor device is provided, which has solder bumps as connection terminals projected in one direction and formed of low melting point alloys, and in which mounting is performed by bringing the solder bumps into contact with corresponding connection terminal pads on a substrate.

The solder bumps are provided with resin reinforcing members formed by applying resins so as to surround the solder bumps thickly at the roots and gradually thinly toward the tips.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

Figure 1A:
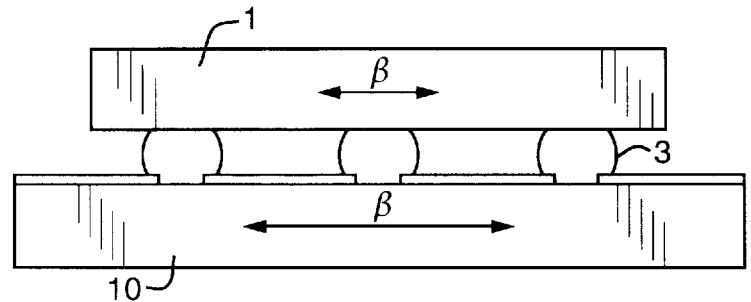
FIGS. 1A and 1B are views illustrating an example of broken solder bumps when a semiconductor chip is mounted on a substrate formed of an organic material.
Figure 1B:
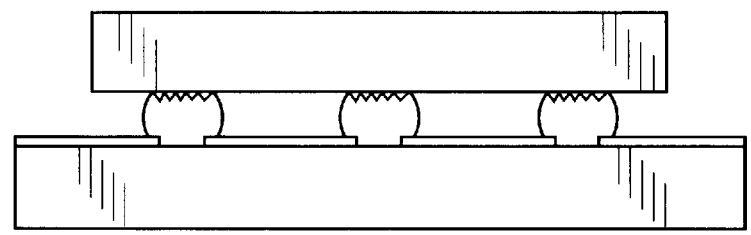
Figure 2:
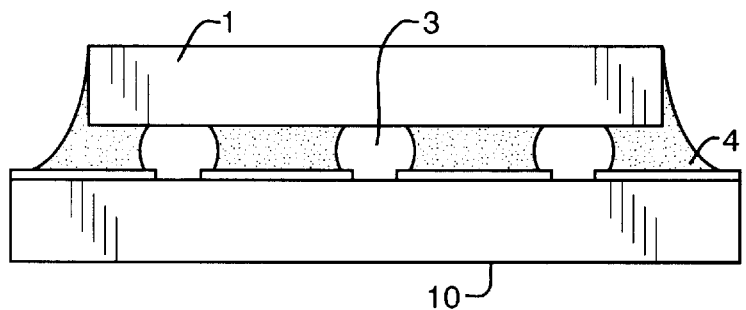
FIG. 2 is a side view showing an example of a conventional second semiconductor device.
Figure 3:
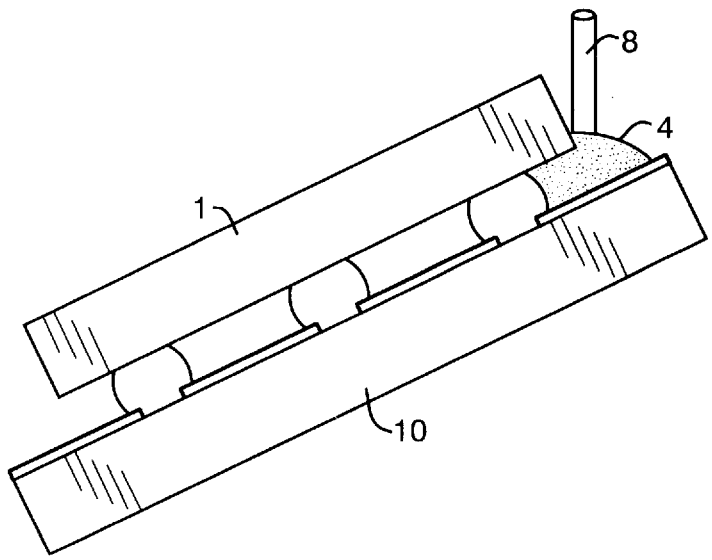
FIG. 3 is a view illustrating a general manufacturing method of a conventional semiconductor device.
Figure 4:
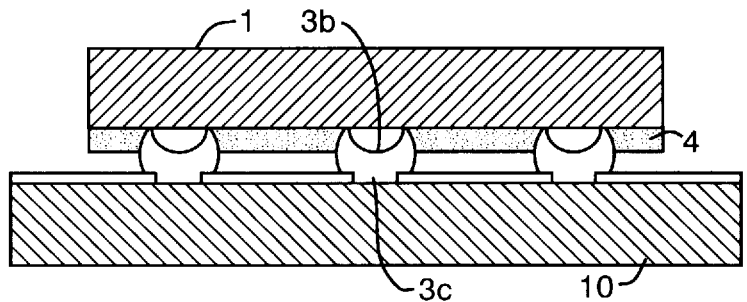
FIG. 4 is a section view showing a conventional fifth semiconductor device.
Figure 5A:
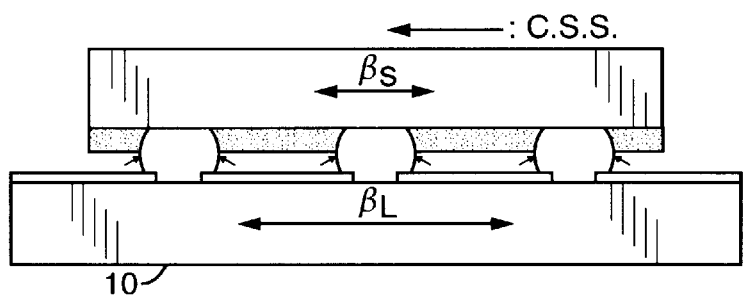
FIGS. 5A and 5B are views illustrating a cause of broken solder bumps of the conventional fifth semiconductor device.
Figure 5B:
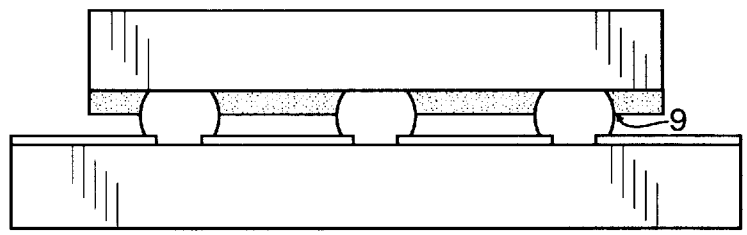
Figure 6A:
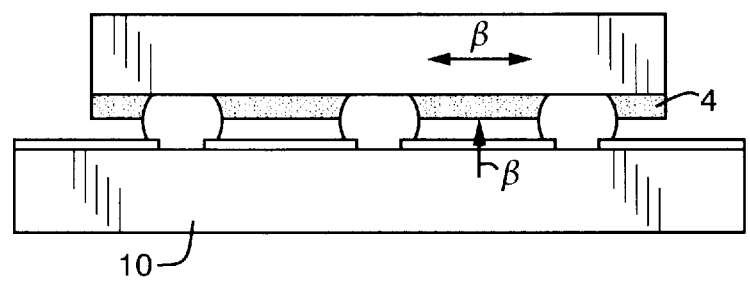
FIGS. 6A, 6B and 6C are views illustrating a condition of a distorted package when a temperature change occurs in the package of the conventional fifth semiconductor device.
Figure 6B:
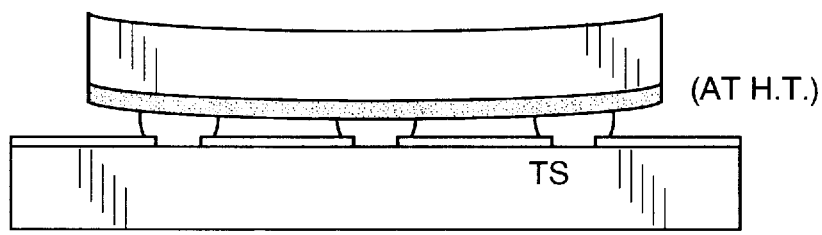
Figure 6C:
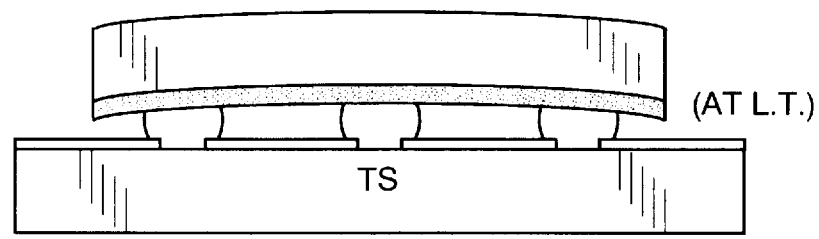
Figure 7A:
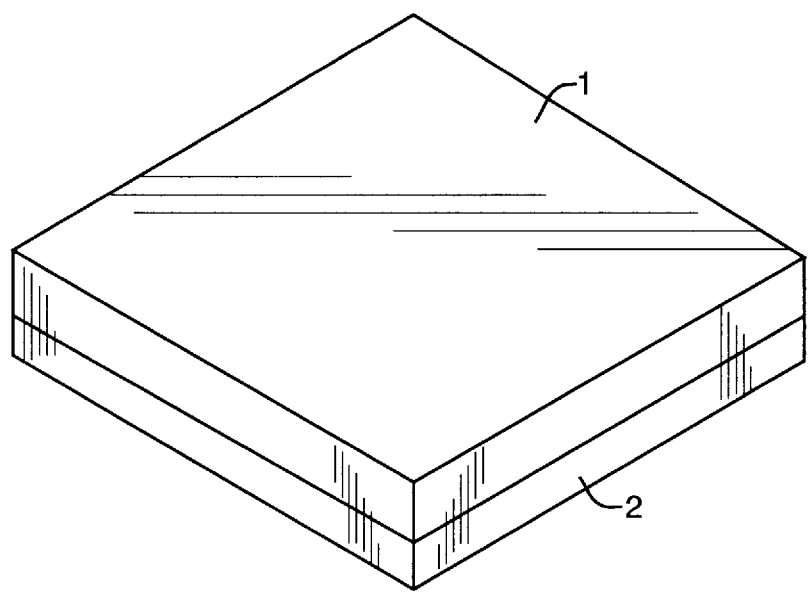
FIGS. 7(A), 7(B) and 7(C) are perspective and section views, each showing a first embodiment of a semiconductor device of the present invention.
Figure 7B:
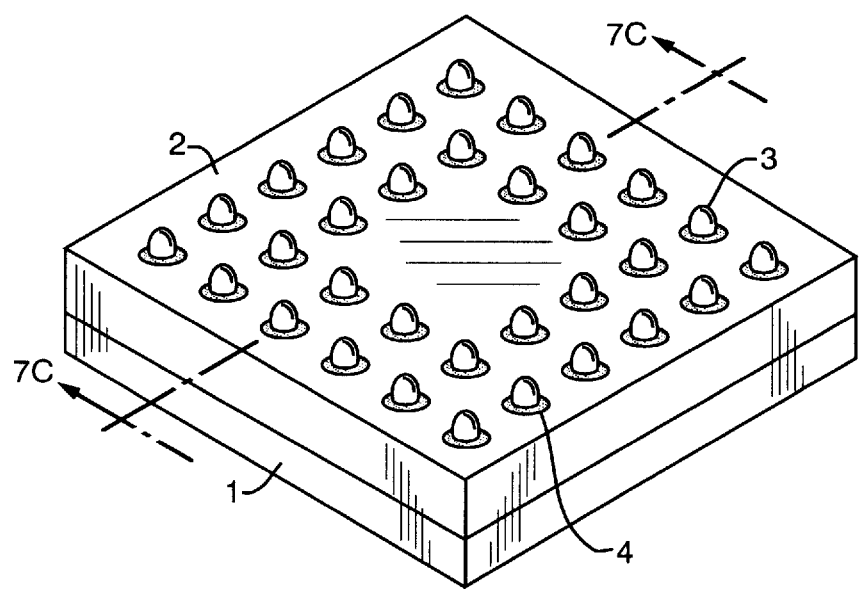
Figure 7C:
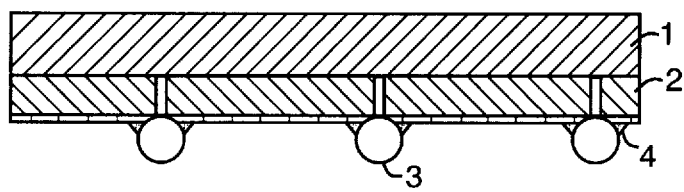

Referring to FIGS. 7(A) and (B), which respectively show in perspective the back and front faces of a semiconductor device of a first embodiment of the present invention, and FIG. 7(C), which is a section view taken along the line 7(C)—7(C) of FIG. 7 (B), the semiconductor device of the embodiment shown in the drawings includes a semiconductor chip 1 having electrode pads on the surface, an interposer 2 composed of a carrier film, which has a wiring pattern formed in one main surface of an insulated film, solder bumps 3 provided on the full surfaces of the semiconductor chip 1 and the interposer 2, and thermosetting and alternatively thermoplastic reinforcing resins 4 applied on the roots of the solder bumps 3.

Figure 8A:
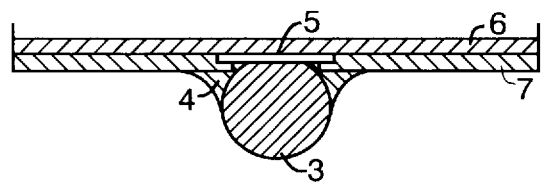
FIGS. 8(A), 8(B) and 8(C) are section and top views, each showing in detail solder bumps in the semiconductor device of the embodiment.
Figure 8B:
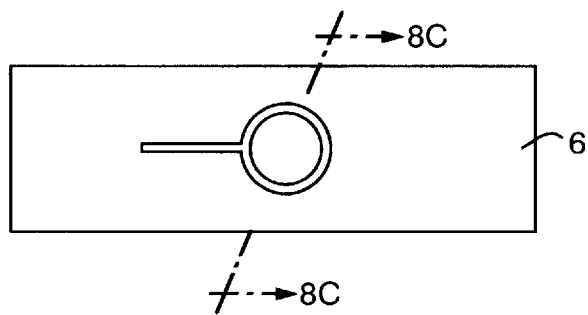
Figure 8C:
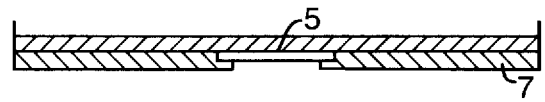
Figure 9A:
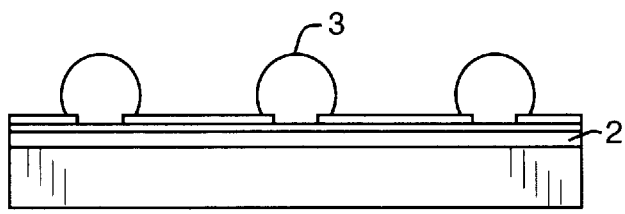
FIGS. 9A, 9B, 9C, 9D, and 9E provide a flow diagram showing a manufacturing method of the semiconductor device of the embodiment.
Figure 9B:
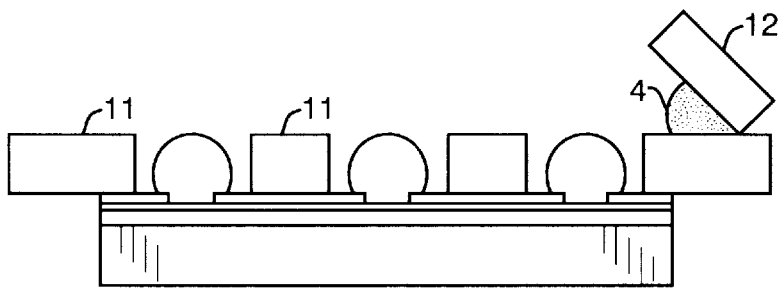
Figure 9C:
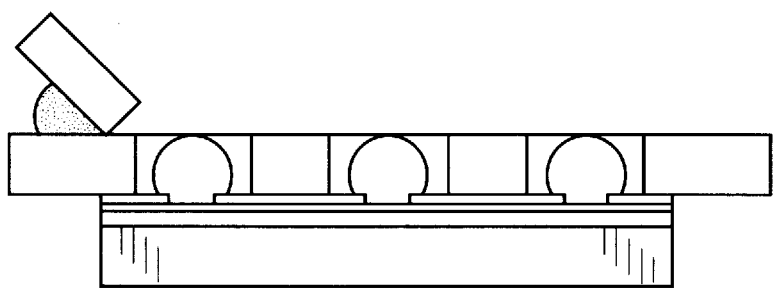
Figure 9D:
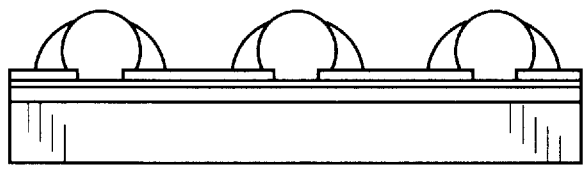
Figure 9E:
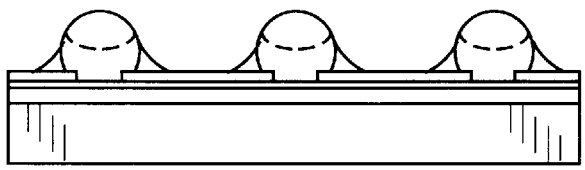

Referring to FIG. 8(A), which is an expanded section view showing the solder bumps 3 of the embodiment, the solder bumps 3 are attached to the wiring pattern 5 of electrode pads in the wiring layer of the base film 6 of a carrier film. Referring to FIGS. 8(B) and (C), which are top and section views taken along the line 11(C)—(C) showing the wiring pattern 5 in detail, a cover coat (alternatively solder resist) 7 is arranged so as to cover the wiring pattern 5.

The structural characteristic of the resins 4 applied on the roots of the solder bumps 3 is that these resins are applied rather thickly at the roots of the solder bumps 3 and gradually thinly toward the upper portions. In other words, these are applied in a fillet manner. No resins 4 are applied on space portions among a plurality of solder bumps 3. Otherwise, even when these are applied, thickness should be extremely thin.

Next, a method of realizing the foregoing structure will be described by referring to FIG. 9, which is a flow diagram showing a manufacturing method of the semiconductor device of the embodiment. As a candidate for this purpose, there is available a thermosetting resin and alternatively a thermoplastic resin. However, during applying of this resin, it is necessary to keep its viscosity somewhat low. Also, even when a thermosetting resin is used, it is preferred to select a resin, which temporarily declines in its viscosity at a high temperature. In the embodiment, as examples of resins 4, which satisfy the above-noted conditions, examples using thermosetting epoxy and polyimide resins and thermoplastic fluorinated resins are respectively shown.

A method of making reinforcing resins goes in a following manner. A semiconductor device having solder bumps 3(A) is first covered by a mask (B) so as to partition each solder bump 3, resins are applied into the mask by using a squeezer, etc., and simultaneously superfluous resins on the solder bumps 3 are rubbed off (C). Then, the mask is removed (D), and in the case of thermosetting resins, a solvent is evaporated by heat and the resins are cured by heat. In the case of thermoplastic resins, these are dried and cured by evaporating a solvent (E).

During application of resins, in other words after the mask has been removed, the resins exist in a fillet form around the solder bumps 3, and as the solvent is evaporated during a heating process, more resins are collected around the solder bumps 3. By the time when curing is finished, resin layers no longer exist at all among the solder bumps 3 and otherwise these become extremely thin.

In order to realize the foregoing structure, it is necessary to dilute resins to be used with a solvent to a certain extent beforehand.

Figure 10:
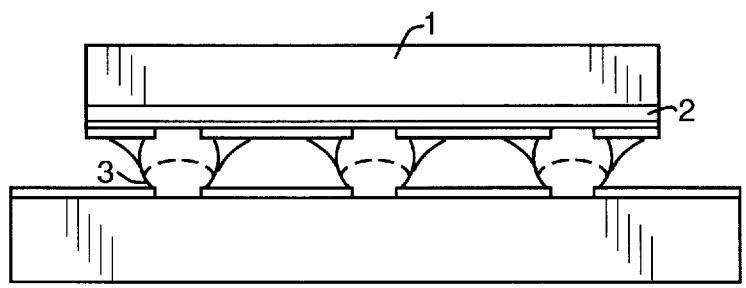
FIG. 10 is a side view showing a condition when the semiconductor device of the embodiment is mounted on a printed board.

Referring to FIG. 10, which is a side view showing a condition when the semiconductor device of the embodiment is mounted on a printed board, the semiconductor device of the embodiment can be mounted only by mounting and reflowing steps as in the case of the ordinary package of BGA, QFP, etc., without adding any particular steps.

As described above, in the structure of the embodiment, the resins 4 applied on the roots of the solder bumps 3 are thick and the resins 4 are thinner toward the tips of the solder bumps 3. This results in dispersion of thermal stress applied on the solder bumps 3 without being concentrated in one spot, making it possible to obtain high mounting reliability. In addition, no resin layers exist at all among the plurality of solder bumps 3 and these are otherwise considerably thin. This eliminates curves in the package created due to the influence of the applied resins and thus no stress occurs in the solder bumps 3. As a result, reliability after mounting can be improved.

In the embodiment, since the resins are applied to considerably high spots of the solder bump side faces, a specified amount of solder can be maintained in each pad in the semiconductor device side even during repairing. Therefore, both in the semiconductor device side and in the substrate side, repairability can be much improved even when eutectic solder is used.

Next, specific examples will be cited. In a first example, which was made based on the condition shown in FIG. 10, epoxy liquid resins (Young's modulus 1000 kgf/mm$^2$, thermal expansion factor 15.0 ppm/°C.) are applied on the solder bumps 3 of the semiconductor device and cured.

In the example, a package size was 7.5 mm in angle, pat sizes 180 to 250 $\mu$m, solder bump sizes 200 to 250 $\mu$m and heights of resins around the solder bumps 100 to 150 $\mu$m.

We mounted this semiconductor device on the printed board and carried out a reliability test described below. Then, we confirmed a considerable improvement in thermal resistance cycling.

Temperature cycle condition: −40 to 125° C.

With no reinforcing resin: 250 cycle

With reinforcing resin (liquid resin): 600 cycle

As a second example, reinforcing resins are formed by using thermosetting polyimide resins (Young's modulus 250 kgf/mm$^2$, thermal expansion factor 50.0 ppm°C.) according to the manufacturing method shown in FIG. 9.

A package sample used in the example is the same as in the case of the first example and resin thickness around the solder bumps is set to 80 to 150 $\mu$m. We carried out the same reliability test as in the case of the first example, and found a large improvement in temperature resistance cycling as follows.

T/C: −40° to 125° C.

With no reinforcing resin: 250 cycle

With reinforcing resin (polyimide): 800 cycle

Figure 11A:
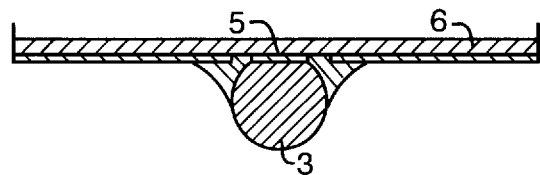
FIGS. 11(A), 11(B) and 11(C) are section and top views, each showing in detail solder bumps, which characterize a second embodiment of a semiconductor device of the present invention.
Figure 11B:
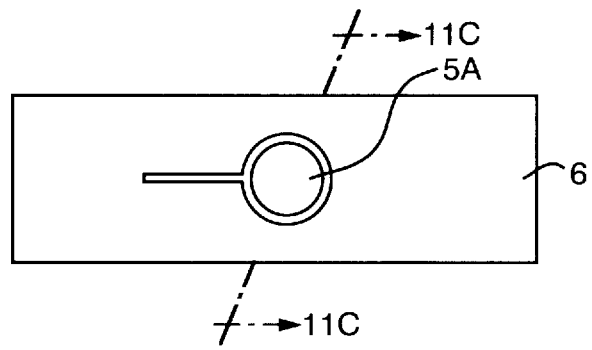
Figure 11C:
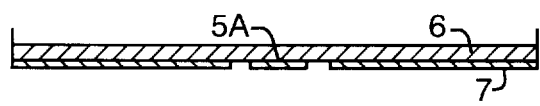

Referring to FIG. 11(A), which is an expanded section view showing a solder bump 3A characterizing a second embodiment of the present invention, FIG. 11 (B) which is a top view showing a wiring pattern 5 in detail, and FIG. 11(C) which is a section view taken along a line 11(C)—11(C), a difference between the solder bump 3A and wiring pattern 5A and those in the first embodiment is that a cover coat 7 is arranged so as to cover only a portion of the wiring pattern 5A.

This results in further improvement in resistance T/C even compared with the structure of the first embodiment.

Using a semiconductor device of the second embodiment, we conducted a reliability test when thermosetting polyimide resins are used as reinforcing resins as in the case of the second example of the first embodiment. As a result, we confirmed a great improvement in temperature resistance cycling.

T/C: −40° to 125° C.

With no reinforcing resin: 250 cycle

With reinforcing resin (polyimide): 1000 cycle

Apparent from the foregoing, by applying the reinforcing resins on the roots of the solder bumps, reliability (temperature resistance cycling) after mounting can be greatly improved compared with no application of the resins.

We conducted tests to confirm how many times repairing can be performed after mounting and found that repairing three times and more is permitted. Considering failure rates of the package, the capability of repairing twice is satisfactory in actual mounting. Thus, the capability of repairing three times and more is more than enough.

The structural advantages of the semiconductor device of the present invention over the conventional semiconductor device are summarized as follows.

(1) An increase in a joining strength in the solder bump root part.

(2) A considerable reduction in stress concentrated in the solder bump root compared with the case that there are no resins.

(3) Prevention of strong stress produced in one spot somewhere in the solder bump because of a gradual reduction in resin thickness in the structure of the invention, whereas strong stress is produced in the boundary between the solder bump root and the resin when the resins are applied in uniform thickness.

(4) Prevention of unnatural bending stress produced in the whole semiconductor device because of no application of resins to intermediate area the plurality of solder bumps.

(5) As a result from the foregoing, an improvement in temperature resistance cycling.

(6) An improvement in repairability.

As apparent from the foregoing, the semiconductor device of the present invention is effective in dispersion of shearing stress to the entire solder bumps, which is produced due to a difference in thermal expansion factors between the package and the substrate and concentrated in the solder bump connection part, and simultaneous suppression of rotational stress, which is produced in the solder bump connection part.

The device is also effective in reduction in tensile stress, which is produced in the surface of the solder bump. This is possible because of the fact that the major portion of the solder bump surface is covered by the resin.

Furthermore, it is possible to prevent damaging of the solder bumps when the semiconductor device is mounted on the printed board, improving reliability after mounting, thereby providing a solder bump structure, which enables repairing of the failed semiconductor device after mounting.

Although the preferred embodiments of the present invention has been described in detail, it should be understood that various changes, substitution and alternations can be made therein without departing from the spirit and scope of the inventions as defined by the appended claims.

What is claimed is:

1. A semiconductor device comprising a semiconductor substrate in which a wiring pattern is formed, said wiring pattern having terminal pads;

solder bumps bonded at their roots to said terminal pads, said solder bonds being at least partially deformed at the contact area between said solder bump and said terminal pad, thereby providing a relatively flat surface area; and an electrically non-conductive resin applied to the solder bumps, said resin being applied relatively thickly at the roots of the solder bumps, and tapering relatively thinly toward the tips of the solder bumps.

2. A semiconductor device as claimed in claim 1, wherein said resins are thermosetting resins.

3. A semiconductor device as claimed in claim 1, wherein said resins are thermoplastic resins.

4. A semiconductor device as claimed in claim 1, wherein said semiconductor device includes a semiconductor chip having electrode pads on the surface and an insulated film layer containing a wiring pattern, and wherein said solder bumps are attached to said wiring pattern and a cover coat film covers a portion of said wiring pattern.

5. A semiconductor device of claim 2 wherein said thermosetting resins are epoxy resins or polyimide resins.

6. A semiconductor device of claim 3 wherein said thermoplastic resins are fluorinated resins.

* * * * *